US006764795B2

(12) United States Patent
Aton et al.

(10) Patent No.: US 6,764,795 B2
(45) Date of Patent: Jul. 20, 2004

(54) METHOD AND SYSTEM FOR MASK PATTERN CORRECTION

(75) Inventors: Thomas J. Aton, Dallas, TX (US); Robert A. Soper, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 152 days.

(21) Appl. No.: 10/225,743

(22) Filed: Aug. 22, 2002

(65) Prior Publication Data

US 2003/0039898 A1 Feb. 27, 2003

Related U.S. Application Data

(60) Provisional application No. 60/315,489, filed on Aug. 27, 2001.

(51) Int. Cl.[7] .............................. G03F 9/00; G06F 17/50
(52) U.S. Cl. ............................................. 430/5; 716/19
(58) Field of Search ....................... 430/5, 322; 716/19, 716/20, 21

(56) References Cited

U.S. PATENT DOCUMENTS 6,282,696 B1 * 8/2001 Garza et al. .................. 716/19

* cited by examiner

*Primary Examiner*—S. Rosasco
(74) *Attorney, Agent, or Firm*—W. James Brady, III; Frederick J. Telecky, Jr.

(57) ABSTRACT

A method and system for mask pattern correction are disclosed. A portion of a mask pattern is segmented into segments (22) that include a base segment (22a) and a relational segment (22b). The relational segment (22b) is matched with the base segment (22a). A proximity correction is determined for the base segment (22a), and a critical dimension correction is determined for the relational segment (22b). The critical dimension correction is determined with respect to the proximity correction of the matching base segment (22a).

27 Claims, 3 Drawing Sheets

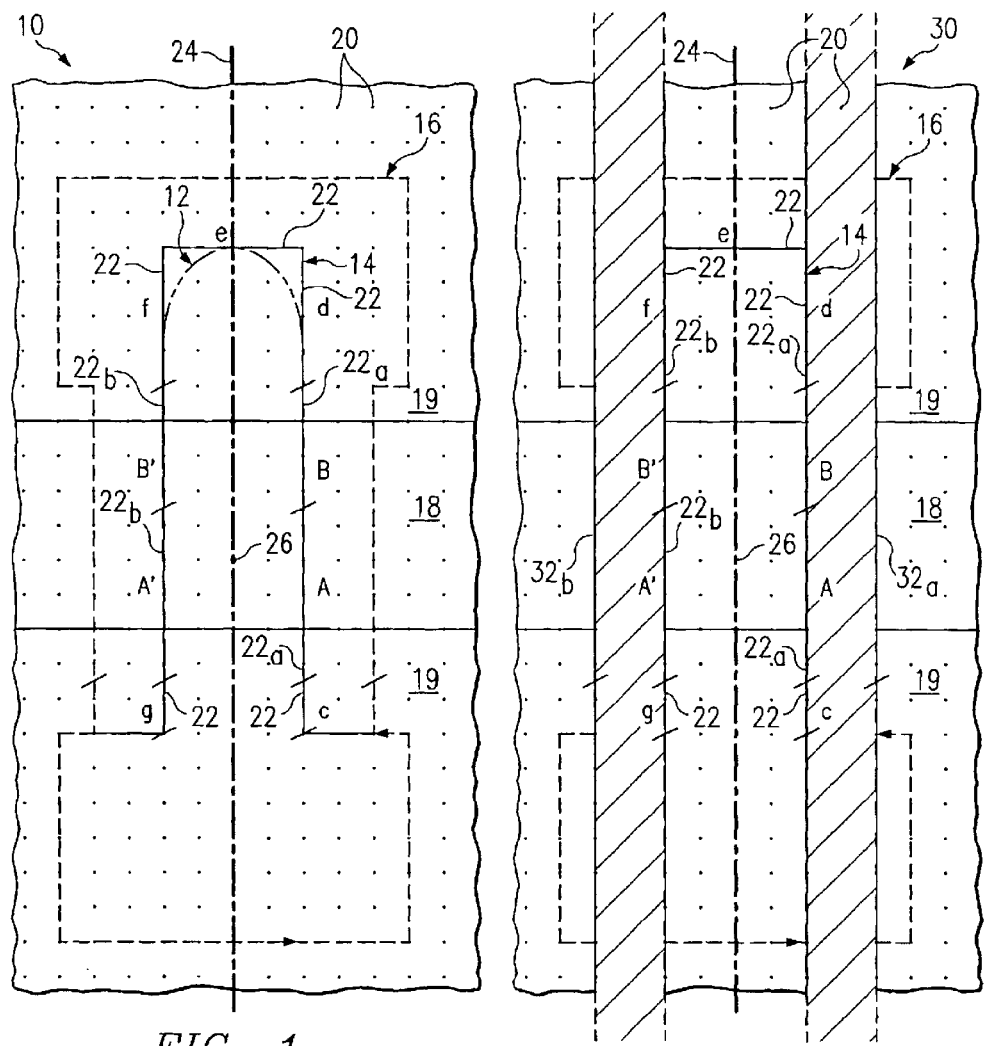
FIG. 1
FIG. 2
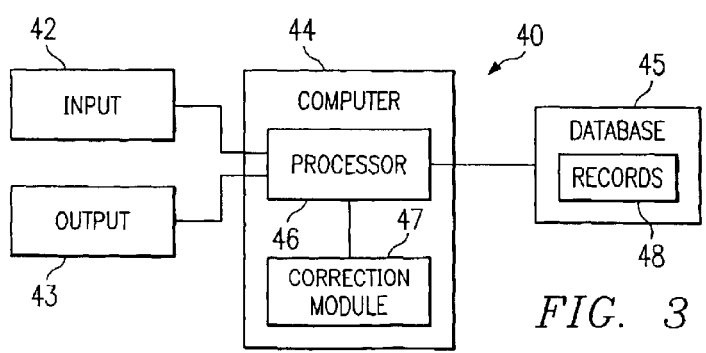
FIG. 3

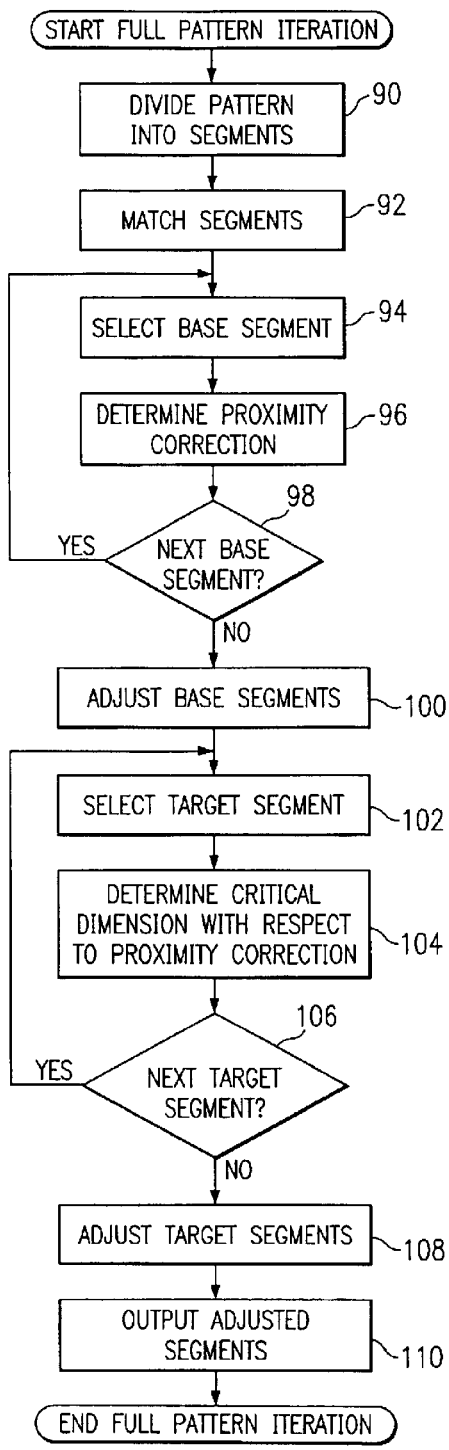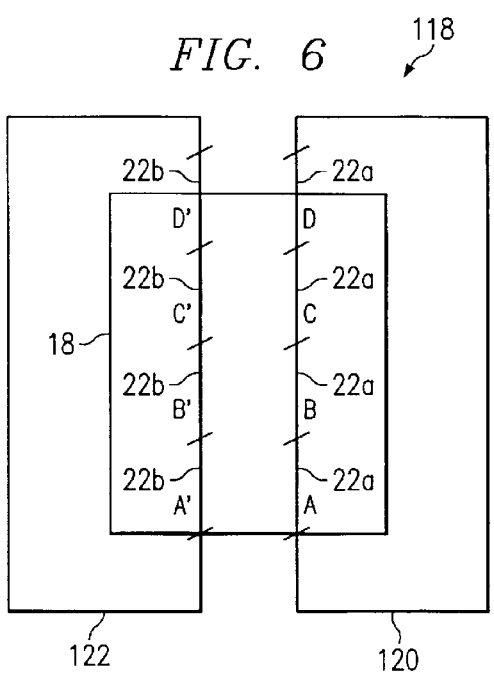

US 6,764,795 B2

METHOD AND SYSTEM FOR MASK PATTERN CORRECTION

This application claims priority under 35 USC § 119(e)(1) of provisional applications Nos. 60/315,489 filed Aug. 27, 2001.

TECHNICAL FIELD OF THE INVENTION

This invention relates generally to the field of integrated circuits and more specifically to a method and system for mask pattern correction.

BACKGROUND OF THE INVENTION

Masks such as photomasks are typically used in photolithographic systems to define patterns on objects such as integrated circuits. The shape of the mask, however, may sometimes differ from the pattern defined on the object. For example, optical diffraction may cause a resulting pattern defined on an integrated circuit to differ from the shapes on the mask. Consequently, masks are typically adjusted to account for these deviations.

SUMMARY OF THE INVENTION

In accordance with the present invention, a method and system for mask pattern correction are provided that substantially eliminate or reduce the disadvantages and problems associated with previously developed systems and methods.

According to one embodiment of the present invention, a method for mask pattern correction is disclosed. A portion of a mask pattern is segmented into segments that include at least one base segment and at least one relational segment. Each relational segment is matched with a base segment. A proximity correction is determined for each base segment. A critical dimension correction is determined for each relational segment. The critical dimension correction is determined with respect to the proximity correction of the matching base segment. Each base segment is adjusted according to the proximity correction, and each relational segment is adjusted according to the critical dimension correction.

Embodiments of the invention may provide numerous technical advantages. A technical advantage of one embodiment may be that a segment of a mask pattern is corrected with respect to an already corrected segment of the mask pattern. By correcting one segment with respect to another segment, a critical dimension defined by the segments may be more readily achieved. Another technical advantage of one embodiment may be that segments that define a critical dimension may be matched, and the matching may be recorded in a record associated with one of the segments. The record may be used to retrieve the corrected position of one segment in order to correct the position of the other segment. Another technical advantage of one embodiment may be that a number of provisional corrections may be used to simultaneously represent the positions of the segments. The correction bars of matched segments may be used to determine a correction for a segment.

Other technical advantages are readily apparent to one skilled in the art from the following figures, descriptions, and claims.

BRIEF DESCRIPTION OF THE DRAWINGS

For a more complete understanding of the present invention and for further features and advantages, reference is now made to the following description, taken in conjunction with the accompanying drawings, in which:

FIG. 1 is a diagram illustrating correction of a mask pattern;

FIG. 2 is a diagram illustrating an uncorrected pattern, a corrected pattern, segments, and correction bars;

FIG. 3 illustrates one embodiment of a system for correcting a mask pattern;

FIG. 5 is a flowchart illustrating another embodiment of a method for correcting a mask pattern; and FIG. 6 is a diagram illustrating correction of a mask pattern that includes multiple polygons.

DETAILED DESCRIPTION OF THE DRAWINGS

Figure 4:
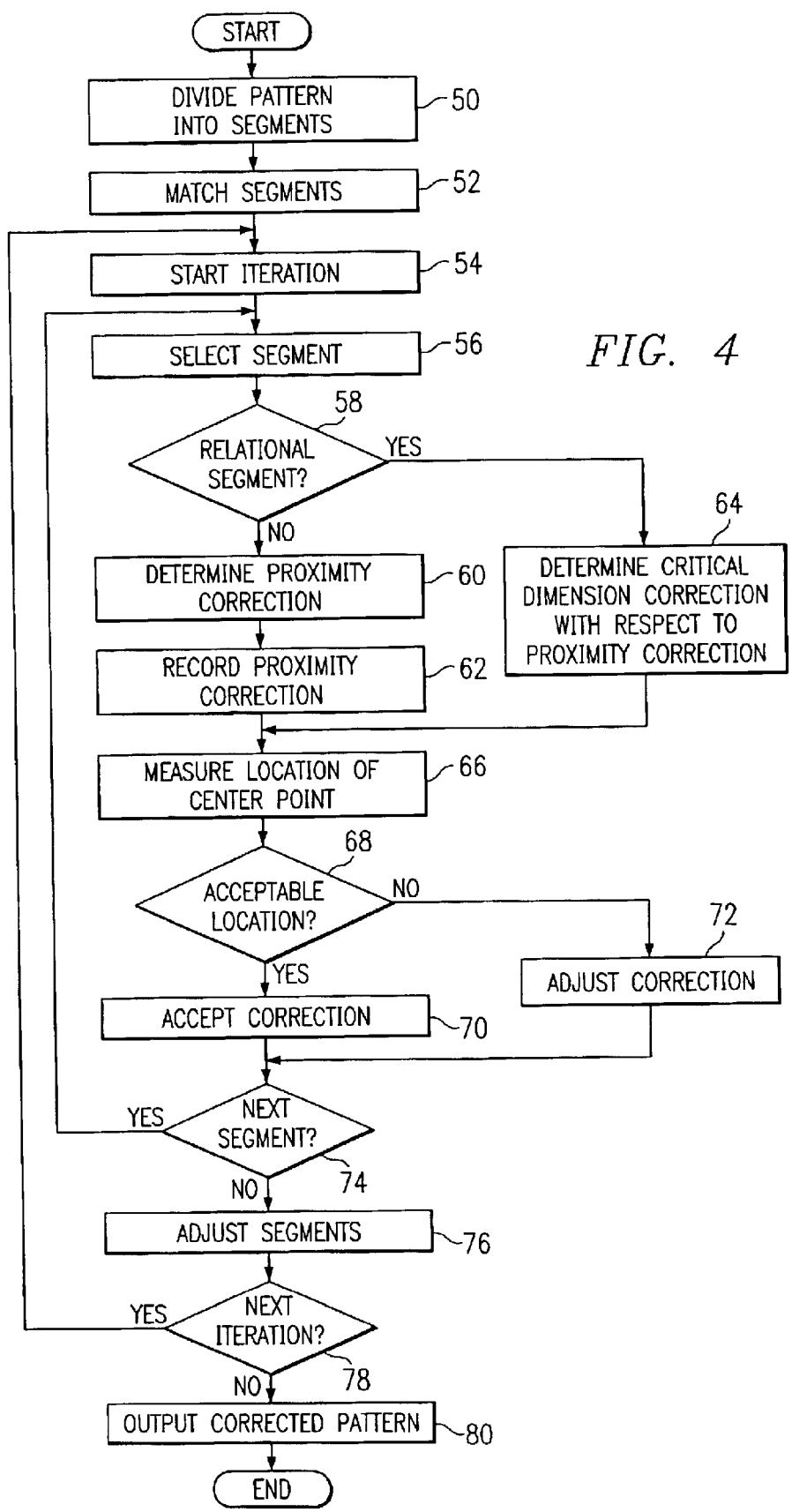
FIG. 4 is a flowchart illustrating one embodiment of a method for correcting a mask pattern.

Embodiments of the present invention and its advantages are best understood by referring to FIGS. 1 through 6 of the drawings, like numerals being used for like and corresponding parts of the various drawings.

FIG. 1 is a diagram 10 illustrating correction of a mask pattern. The mask pattern may comprise, for example, all or a portion of any suitable photomask such as a binary mask, an attenuated mask, an alternating phase mask, or any other photomask suitable for defining a pattern on an integrated circuit. Diagram 10 includes a contour 12, an uncorrected pattern 14, and a corrected pattern 16. Uncorrected pattern 14 may be corrected to yield corrected pattern 16 that defines contour 12 on an object.

Contour 12 represents a desired pattern that a mask may define on an object such as an integrated circuit. In the illustrated example, contour 12 defines a transistor gate of an integrated circuit with an active, or diffusion, region 18 and an inactive, or field, region 19. Contour 12 may have critical dimensions. A critical dimension is a dimension that may be required to be defined with a high degree of accuracy. For example, a contour 12 that defines a transistor gate may have the width of the gate as a critical dimension. The width may be required to be defined with an accuracy of, for example, approximately one nanometer.

Uncorrected pattern 14 represents a mask pattern for contour 12 that has not been corrected. Uncorrected pattern 14 may be corrected for deviations that may occur during the manufacturing process of an integrated circuit. For example, deviations may result from optical diffraction, etch effects, mask making errors, resist effects, or other effects occurring during the manufacturing process. To compensate for these deviations, uncorrected pattern 14 may be adjusted to yield corrected pattern 16.

Diagram 10 includes an abstract grid 20 that may define the possible positions of corrected pattern 16. Corrected pattern 16 may be placed on abstract grid 20. Abstract grid 20 may be defined by intervals of, for example, approximately two to five nanometers. The requirement that corrected pattern 16 fall on abstract grid 20 may result in a loss of accuracy, which may affect the formation of contour 12, particularly at the critical dimensions of contour 12.

In the illustrated example, uncorrected pattern 14 may be divided into segments 22 designated as segments A, A', B, B', c, d, e, f, and g. A correction for each segment 22 may be computed individually, and each segment 22 may be adjusted individually from uncorrected pattern 14 to corrected pattern 16. "Each" as used in this document means each member of a set or each member of a subset of the set. Corrections may be computed in a sequential manner around uncorrected pattern 14. For example, the following sequence may be used, segments c, A, B, d, e, f, B', A', and g.

In the illustrated example, capital letters represent segments 22 that define a critical dimension. The distance between segment A and segment A' and the distance between segment B and segment B' define the width of a gate over diffusion region 18, which is a critical dimension. Segments 22 that define a critical dimension may be matched. For example, segments A and A' may be matched. The matching of the segments may be recorded. For example, the matching of segments A and A' may be recorded in a record such as a table associated with segment A'.

Segments 22 that define a critical dimension may be corrected by first correcting a base segment 22a according to a proximity correction, and then correcting a relational segment 22b according to a critical dimension correction. A proximity correction is performed to compensate for deviations that may occur during a manufacturing process. A proximity correction may be performed using, for example, optical proximity correction software such as TAURUS-OPC software by AVANT! Corporation. A critical dimension correction is performed to adjust the position of relational segment 22b with respect to base segment 22a. The critical dimension correction of relational segment 22b is calculated with respect to the position of base segment 22a after the proximity correction. For example, base segment A may be corrected according to a proximity correction. Relational segment A' may then be corrected according to a critical dimension correction, which is calculated using the position of base segment A after the proximity correction. The critical dimension may be recorded in a record associated with segments 22 that define the critical dimension.

A center line 24 may be used to control the correction of segments 22. Center line 24 may be defined substantially along an axis of symmetry of contour 12. During the correction process, some segments 22 may be moved towards one side and other segments may be moved towards another side, resulting in a jagged pattern. For example, segments A and A' may be moved towards the left, while segments B and B' may be moved towards the right. To control this movement, a center point 26 between matched segments 22 may be determined, and segments 22 may be corrected such that center point 26 remains approximately at or near center line 24.

FIG. 2 is a diagram 30 illustrating uncorrected pattern 14, corrected pattern 16, segments 22, and correction bars 32. A provisional correction is a region that may be added or subtracted from an uncorrected pattern in order to determine a correction of the uncorrected pattern. In one embodiment, a strip of effectively infinite extent may be used to represent a provisional correction. For example, a PROTOBAR of the TAURUS-OPC software of AVANT! CORPORATION may be used to represent a provisional correction strip. Any suitable method for provisional correction, however, may be used In the illustrated example, provisional corrections are represented by correction bars 32. A correction bar 32 that represents a provisional correction of base segment 22a may be used to determine a critical dimension correction of relational segment 22b, which may also be represented by a correction bar 32. For example, correction bar 32a, which represents a provisional correction of base segment A, may be used to determine a critical dimension correction of relational segment A', which may be represented by correction bar 32b.

FIG. 3 illustrates a system 40 for correcting a mask pattern. System 40 includes an input device 42 and an output device 43 coupled to a computer 44, which is in turn coupled to a database 45. Input device 42 may comprise, for example, a keyboard, a mouse, or any other device suitable for transmitting data to computer 44. Output device 43 may comprise, for example, a display, a printer, or any other device suitable for outputting data received from computer 44.

Computer 44 may comprise a personal computer, workstation, network computer, wireless computer, or one or more microprocessors within these or other devices, or any other suitable processing device. Computer 44 may include a processor 46 and a correction module 47. Processor 46 controls the flow of data between input device 42, output device 43, database 45, and correction module 47. Correction module 47 may receive descriptions of contour 12 and uncorrected pattern 14, and compute corrected pattern 16 that maybe used to define contour 12.

Database 45 may comprise any suitable system for storing data. Database 45 may store records 48 that include data associated with contour 12, uncorrected pattern 14, and corrected pattern 16. A record 48 may be associated with a segment 22a, and may describe a matching segment 22b or critical dimension corresponding to the segment 22a. Record 48 may describe correction bar 32 that represents of the position of segment 22.

FIG. 4 is a flowchart illustrating one embodiment of a method for correcting a mask pattern. During each iteration of the illustrated method, a proximity correction for base segment 22a is computed, the correction is recorded, and a critical dimension correction with respect to corrected base segment 22a is computed for relational segment 22b. The segments are adjusted from their uncorrected positions to their corrected positions at the end of each iteration.

The method begins at step 50, where pattern 14 is divided into segments 22. Segments 22 include segments A, A', B, B', c, d, e, f, and g. Segments 22 that define critical dimensions are matched at step 52. Segment A is matched with segment A', and segment B is matched with segment B'. The matchings of segments A and A' and segments B and B' may be recorded in records 48 associated with segments A' and B', respectively.

An iteration is started at step 54, and a segment 22 is selected at step 56. At step 58, the method determines whether the selected segment 22 is a relational segment 22b. Relational segment 22b may be identified by a matching with base segment 22a recorded in record 48 associated with relational segment 22b. A non-relational segment may comprise a base segment or other segment 22. Base segment 22a may be identified by a base segment identifier in record 48 associated with base segment 22a, or may be identified by the absence of a matching recorded in record 48. Other segment 22 may comprise a segment associated with field region 19.

If the selected segment 22 is not a relational segment 22b, the method proceeds to step 60 to determine a proximity correction for selected segment 22. In the illustrated example, the selected segment 22 comprises base segment A. Base segment A is corrected according to a proximity correction process. The proximity correction may be computed as a correction bar 32, and is recorded at step 62.

If at step 58, the method determines that the selected segment 22 is a relational segment 22b, the method proceeds to step 64 to determine a critical dimension correction with respect to the proximity correction of matching base segment 22a. A critical dimension correction may be computed by calculating correction bar 32b of relational segment 22b with respect to correction bar 32a of base segment 22a such that a critical dimension requirement may be approximated. For example, correction bar 32a represents a corrected position of segment A. Correction bar 32b, which represents a position of segment A', may be calculated such that segments A and A' form contour 12 that approximates a critical dimension requirement for the width of a transistor gate. In one embodiment, correction bar 32a may be retrieved using a matching recorded in record 48 associated with relational segment 22b.

At step 66, the location of center point 26 between matched segments 22 is determined. If at step 68 the location is acceptable, the correction is accepted at step 70. If the location is not acceptable at step 68, the correction is adjusted at step 72.

At step 74, the method determines whether there is a next segment 22. If there is a next segment 22 the method returns to step 56 to select the next segment 22. If there is no next segment 22, the method proceeds to step 76 to adjust segments 22 from their uncorrected positions to their corrected positions. At step 78, the method determines whether there is a next iteration. If there is a next iteration, the method returns to step 54 to start the next iteration. If there is no next iteration, the method proceeds to step 80 to output corrected pattern 16. After outputting corrected pattern 16, the method terminates.

FIG. 5 illustrates another embodiment of a method for correcting a mask pattern. For simplicity, only the equivalents of steps 54 through 78 of FIG. 4 are shown. That is, only one full pattern iteration is shown. During an iteration of the illustrated method, corrections for non-relational segments 22 including base segments 22a are computed and non-relational segments 22 are adjusted according to the corrections. During a next iteration, corrections for relational segments 22b are computed with respect to adjusted base segments 22a.

The method begins at step 90, where uncorrected pattern 14 is divided into segments 22. Segments 22 are matched at step 92, and a non-relational segment 22 is selected at step 94. A proximity correction for non-relational segment 22 is determined at step 96. At step 98, the method determines whether there is a next non-relational segment 22. If there is a next non-relational segment 22, the method returns to step 94 to select the next non-relational segment 22. If there is no next non-relational segment 22, the method proceeds to step 100 to adjust corrected non-relational segments 22 including base segments 22a. A record 48 associated with each non-relational segment 22 may be used to store the adjusted position of non-relational segment 22.

At step 102, a relational segment 22b is selected. In one embodiment, record 48 associated with relational segment 22b records the matching with base segment 22a. A critical dimension correction with respect to the proximity correction of matched base segment 22a is determined at step 104. The critical dimension correction may be determined in a manner substantially similar to that described at step 64 of FIG. 4.

At step 106, the method determines whether there is a next relational segment 22b. If there is a next relational segment 22b, the method returns to step 102 to select the next relational segment 22b. If there is no next relational segment 22b, the method proceeds to step 108 to adjust the relational segments 22b. At step 110, the adjusted segments 22 are outputted. After outputting segments 22, the method terminates or proceeds to determine correction of relational and non-relational segments.

FIG. 6 is a diagram 118 illustrating correction of a mask pattern that includes one or more polygons 120 and 122. The mask pattern may comprise, for example, an alternating phase mask, which may also be referred to as a strong phase shift mask, or any other suitable photomask. A mask pattern may include polygons 120 and 122 that are used to define the width of a transistor gate over diffusion region 18. Polygons 120 and 122 may represent phase blocks. For example, polygon 120 may represent a phase block with a phase shift of approximately zero, and polygon 122 may represent a phase block with a phase shift of approximately pi. Polygons 120 and 122 may include base segments 22a, labeled A, B, C, and D, and relational segments 22b labeled A', B', C', and D'. Base segments 22a may be matched with relational segments 22b, for example, segments A and A' may be matched.

A critical dimension correction may be performed for polygons 120 and 122 by adjusting base segments 22a and then adjusting relational segments 22b with respect to adjusted base segments 22a for proper critical dimension correction.

While the examples given have been with respect to patterning transistor gates over diffusion regions, the methods and systems described herein may also be used to correct patterns of other layers of integrated circuits. For example, the interconnect parts of a metal pattern may be divided into base and relational segments for improved critical dimension correction, leaving the corners and contact/via pads to be corrected as traditional placement-correction segments.

A technical advantage of one embodiment may be that relational segment 22b is corrected with respect to a corrected base segment 22a. By correcting relational segment 22b with respect to base segment 22a, a critical dimension defined by segments 22 may be more readily achieved. Another technical advantage of one embodiment may be that base segment 22a and relational segment 22b that define a critical dimension may be matched, and the matching may be recorded in record 48 associated with relational segment 22b. Record 48 may be used to retrieve the corrected position of base segment 22a in order to correct the position of relational segment 22b. Another technical advantage of one embodiment may be that a number of correction bars 32 may be used to simultaneously represent the positions of the segments 22. Correction bars 32 of matched segments 22 may be used to determine a correction for a relational segment 22b.

Although an embodiment of the invention and its advantages are described in detail, a person skilled in the art could make various alterations, additions, and omissions without departing from the spirit and scope of the present invention as defined by the appended claims.

What is claimed is:

1. A method for mask pattern correction, the method comprising:

segmenting a portion of a mask pattern into a plurality of segments comprising at least one base segment and at least one relational segment;

matching a relational segment with a base segment;

determining a proximity correction for a matched base segment;

determining a critical dimension correction for a matched relational segment, the critical dimension correction determined with respect to the proximity correction of the associated matched base segment;

adjusting a base segment according to the proximity correction; and adjusting a relational segment according to the critical dimension correction.

2. The method of claim 1, wherein determining a critical dimension correction for a matched relational segment comprises:
   adjusting a base segment according to the proximity correction, the base segment matching the matched relational segment; and
   using the adjusted base segment to determine the critical dimension correction for the matched relational segment.

3. The method of claim 1, wherein determining a critical dimension correction for a matched relational segment comprises:
   recording the proximity correction of a base segment, the base segment matching the matched relational segment; and
   using the recorded proximity correction to determine the critical dimension correction for the matched relational segment.

4. The method of claim 1, wherein matching a relational segment with a base segment comprises recording the matching in a record associated with the relational segment.

5. The method of claim 1, wherein:
   the portion of the mask pattern has an axis, the axis comprising an approximate axis of symmetry of the portion; and
   segmenting the portion of the mask pattern comprises defining a base segment on a first side of the axis and defining a relational segment on a second side of the axis.

6. The method of claim 1, wherein the portion of the mask pattern has an axis, the axis comprising an approximate axis of symmetry of the portion, and further comprising:
   determining a midpoint associated with the proximity correction and the critical dimension correction; and
   adjusting the proximity correction and the critical dimension correction according to the midpoint and the axis.

7. The method of claim 1, further comprising:
   associating the proximity correction of a base segment with a first correction bar;
   associating the critical dimension correction of a relational segment with a second correction bar; and
   using the first correction bar and the second correction bar to determine the critical dimension correction of the relational segment.

8. The method of claim 1, wherein the mask pattern comprises a binary mask.

9. The method of claim 1, wherein the mask pattern comprises an attenuated phase mask.

10. The method of claim 1, wherein the mask pattern comprises an alternating phase mask.

11. The method of claim 1, wherein a polygon comprises the base segment and the relational segment.

12. The method of claim 1, wherein a first polygon comprises the base segment, and a second polygon comprises the relational segment.

13. The method of claim 1, wherein a first polygon representing a first phase type of an alternating phase mask comprises the base segments, and a second polygon representing a second phase type of the alternating phase mask comprises the relational segments.

14. A method for mask pattern correction, the method comprising:
   segmenting a portion of a mask pattern into a plurality of segments;
   associating a correction of a segment with a correction bar; and
   determining a correction of a segment by utilizing any number of correction bars associated with the corrections of other segments.

15. The method of claim 14, wherein:
   associating a correction of a segment with a correction bar comprises:
      associating a proximity correction with a first correction bar; and
      associating a critical dimension correction with a second correction bar;
   determining a correction of a segment comprises determining the critical dimension correction utilizing the first correction bar and the second correction bar.

16. A system for mask pattern correction, the system comprising:
   a database operable to store a plurality of records, the records describing a portion of a mask pattern; and
   a correction module coupled to the database and operable to:
      segment the portion of the mask pattern into a plurality of segments comprising at least one base segment and at least one relational segment;
      match a relational segment with a base segment;
      determine a proximity correction for a matched base segment;
      determine a critical dimension correction for a matched relational segment, the critical dimension correction determined with respect to the proximity correction of the associated matched base segment;
      adjust a base segment according to the proximity correction; and
      adjust a relational segment according to the critical dimension correction.

17. The system of claim 16, wherein a correction module is operable to determine the critical dimension correction for a matched relational segment by:
   adjusting a base segment according to the proximity correction, the base segment matching the matched relational segment; and
   using the adjusted base segment to determine the critical dimension correction for the matched relational segment.

18. The system of claim 16, wherein a correction module is operable to determine the critical dimension correction for a matched relational segment by:
   recording the proximity correction of a base segment, the base segment matching the matched relational segment; and
   using the recorded proximity correction to determine the critical dimension correction for the matched relational segment.

19. The system of claim 16, wherein the correction module is operable to match a relational segment with a base segment by recording the matching in a record associated with the relational segment.

20. The system of claim 16, wherein:
   the portion of the mask pattern has an axis, the axis comprising an approximate axis of symmetry of the portion; and
   the correction module is operable to segment the portion of the mask pattern by defining a base segment on a first side of the axis and defining a relational segment on a second side of the axis.

21. The system of claim 16, wherein the portion of the mask pattern has an axis, the axis comprising an approximate axis of symmetry of the portion, and the correction module is operable to:

determine a midpoint associated with the proximity correction and the critical dimension correction; and adjust the proximity correction and the critical dimension correction according to the midpoint and the axis.

22. The system of claim 16, wherein the correction module is operable to:

associate the proximity correction of a base segment with a first correction bar;

associate the critical dimension correction of a relational segment with a second correction bar; and use the first correction bar and the second correction bar to determine the critical dimension correction of the relational segment.

23. The system of claim 16, wherein the mask pattern comprises a binary mask.

24. The system of claim 16, wherein the mask pattern comprises an attenuated phase mask.

25. The system of claim 16, wherein the mask pattern comprises an alternating phase mask.

26. A system for mask pattern correction, the system comprising:

a database operable to store a plurality of records, the records describing a portion of a mask pattern; and a correction module coupled to the database and operable to:

segment the portion of the mask pattern into a plurality of segments;

associate a correction of a segment with a correction bar; and determine a correction of a segment by utilizing any number of correction bars associated with the corrections of other segments.

27. A method for mask pattern correction, the method comprising:

segmenting a portion of a mask pattern into a plurality of segments comprising at least one base segment and at least one relational segment, the portion of the mask pattern operable to pattern a region of an integrated circuit;

matching each relational segment with a base segment;

recording the matching in a record associated with the relational segment;

determining a proximity correction for each base segment;

representing the proximity correction of each base segment with a first correction bar;

recording the proximity correction of each base segment;

determining a critical dimension correction for each relational segment, the critical dimension correction determined with respect to the recorded proximity correction of the matching base segment by:

representing the critical dimension correction of a relational segment as a second correction bar; and using the first correction bar and the second correction bar to determine the critical dimension correction of the relational segment;

adjusting each base segment according to the proximity correction; and adjusting each relational segment according to the critical dimension correction.

* * * * *